United States Patent [19]
Gabbai

[11] Patent Number: 5,856,907
[45] Date of Patent: Jan. 5, 1999

[54] CONTINUOUS SUPERCAPACITOR

[75] Inventor: Eran Gabbai, Kfar Maas', Israel

[73] Assignee: Interplex Energy Ltd., Bazra, Israel

[21] Appl. No.: 833,084

[22] Filed: Apr. 4, 1997

[51] Int. Cl.⁶ ............................. H01G 4/06; H01G 4/38
[52] U.S. Cl. ...................................... 361/321.5; 361/329
[58] Field of Search ................................ 361/502, 305,
361/329, 321.5, 679, 283.4, 283.1, 794,
792, 816

[56] References Cited

U.S. PATENT DOCUMENTS

| | | | |
|---|---|---|---|
| 5,151,848 | 9/1992 | Finello | 361/502 |
| 5,245,512 | 9/1993 | Rounds | 361/504 |
| 5,426,561 | 6/1995 | Yen et al. | 361/502 |

OTHER PUBLICATIONS

Frigichip Thermoelectric Cooling Devices, Thermoelectric Handbook, pp. 1–51, © 1995.

Primary Examiner—Kristine Kincaid
Assistant Examiner—Anthony Dinkins
Attorney, Agent, or Firm—Kenyon & Kenyon

[57] ABSTRACT

The present invention is directed to a continuous supercapacitor. The continuous supercapacitor includes a core of one or more atomic elements, and a one-atomic-layer-thick jacket composed of an atomic element selected from those making up the core. The core and jacket are separated by a gap containing outer valence electrons, with the jacket acting as a Faraday cage for the electrons. The gap is dimensioned such that the outer valence electrons vibrate a frequency, preferably ranging from about 1 to 5 gHz.

8 Claims, 3 Drawing Sheets ns 5,856,907

CONTINUOUS SUPERCAPACITOR

BACKGROUND OF THE INVENTION

The present invention is directed to a continuous supercapacitive device which provides, among other things, an electrical output over a range of frequencies, with an accompanying surface vibration.

There is presently an ongoing need for devices which can be used as sources for electricity over a wide range of voltages and frequencies. The present invention provides a novel device for such purposes.

SUMMARY OF THE INVENTION

According to an embodiment of the present invention, there is provided a method of making a continuous supercapacitor. The method comprises providing a core filament of one or more elements; subjecting the core to a first magnetic field by applying a first voltage to a variac; cooling the core to less than 5° K; providing a second magnetic field greater than the first magnetic field to release outer valence electrons (such as p, d, and f electrons) from the core; and exposing the core to a third magnetic field in the presence of a gas to provide a jacket composed of an element in common with the core, wherein the jacket is separated from the core by a gap which contains the outer valence electrons. The gap is dimensioned such that the electrons preferably vibrate at a frequency of about 1 to 5 gigahertz.

The filament is preferably formed by extrusion under elevated temperatures, more preferably by extrusion of fine particles ranging in size from about 0.5 to 10 Å under elevated temperatures achieved by induction. The core preferably comprises Ba and Ti, and the elevated temperatures preferably range from about 800° to 1000 °C. The voltages used to generate the first, second and third magnetic fields are preferably about 65,000 V, 100,000 V and 150,000 V, respectively. The jacket is preferably composed of Ba and said gas is preferably $SO_6$.

The continuous supercapacitor produced according to the method of the present invention comprises a core of one or more atomic elements, and a one-atomic-layer-thick jacket composed of an atomic element selected from those making up the core. The core and jacket are separated by a gap containing outer valence electrons, with said jacket acting as a Faraday cage for the electrons. The gap is dimensioned such that the outer valence electrons vibrate at an ongoing continuous frequency, preferably ranging from about 1 to 5 gHz, more preferably 2.45 gHz.

Preferably, the core is on the order of 0.001 mm in diameter and comprises two or more elements that are separated by no more than one column of the periodic table, more preferably barium and titanium. The jacket preferably is composed of a metal, more preferably barium.

DETAILED DESCRIPTION

Figure 1:
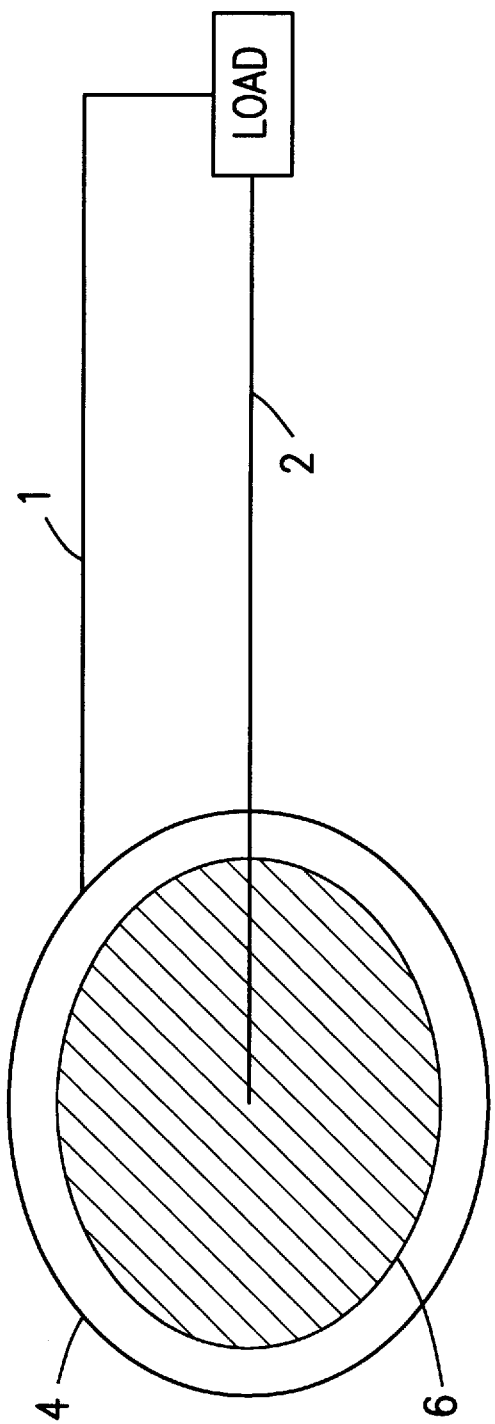
FIG. 1 is a diagram of the continuous supercapacitive device of the present invention.

The continuous supercapacitor of the present invention is preferably made by the following process.

First, starting materials containing the atomic constituents of the core are heated, preferably by induction, and extruded through a die to form a filament. The extruded filament is then cooled, preferably to a temperature of about 200° C., whereupon it is subjected to a first magnetic field. It is believed that the magnetic field partially opens the molecular orbitals within the material. The filament is then further cooled to a temperature of about 5° K or below, and a second magnetic field greater than the first magnetic field is applied. It is believed that this process step completes the opening of the molecular orbitals within the material. As a result, the valence electrons are released from their shells and migrate to the surface of the core, forming a corrected core.

The corrected core is then jacketed by a single atomic layer of an element found in the core. This jacket acts as a Faraday cage for the valence electrons and is formed by exposing the corrected core to a gas at high applied voltage. The jacket and core are separated by a gap dimensioned as set forth above.

A more preferred process of forming the continuous supercapacitor of the present invention follows.

First, one or more powders which provide the atomic constituents of the core are supplied. By way of example only, the present discussion will focus on a barium-titanium core. In this case, barium and titanium powders are used, both of which are commercially available through, for example, AMP, Inc.

Equimolar amounts of the barium and titanium powder are heated to an elevated temperature by induction. The magnetron used for inductive heating is preferably operated at a voltage of 220 to 380 V, an amperage of 10 to 20 A and a frequency of 1 to 5 gHz. The frequency is preferably correlated to the grain size of the powder to speed the induction process. Typically, the powders are ground down to a size ranging from about 0.5 to 10 Å, more preferably about 4 Å. According to a preferred grinding process, the powders are first ground in a mill, using diamond grinding media, until a size of about 40Å is achieved. These particles are then cooled to a temperature of 5K or less whereupon the thermal stress and strain breaks the particles to the desired particle size.

The combined powders are heated with the magnetron to a temperature of about 800° to 1100° C., more preferably about 860° C., and extruded, preferably by gravity, through a circular die of about 0.01 to 0.015 mm.

After the extruded Ba-Ti filament is cooled to a temperature of about 200° C., it is then placed between the field poles of a variac within a Faraday cage. The variac is preferably operated at a voltage of 65,000 V. As a result, the filament is subjected to a high intensity magnetic field. The Ba-Ti filament is then cooled to a temperature of about 5° K or below. While this can be done using liquid helium, which has a boiling point of 4.215° K, it is preferably accomplished by cooling to a temperature of about 77° K using liquid nitrogen, followed by electronic cooling according to the present invention.

Figure 2A:
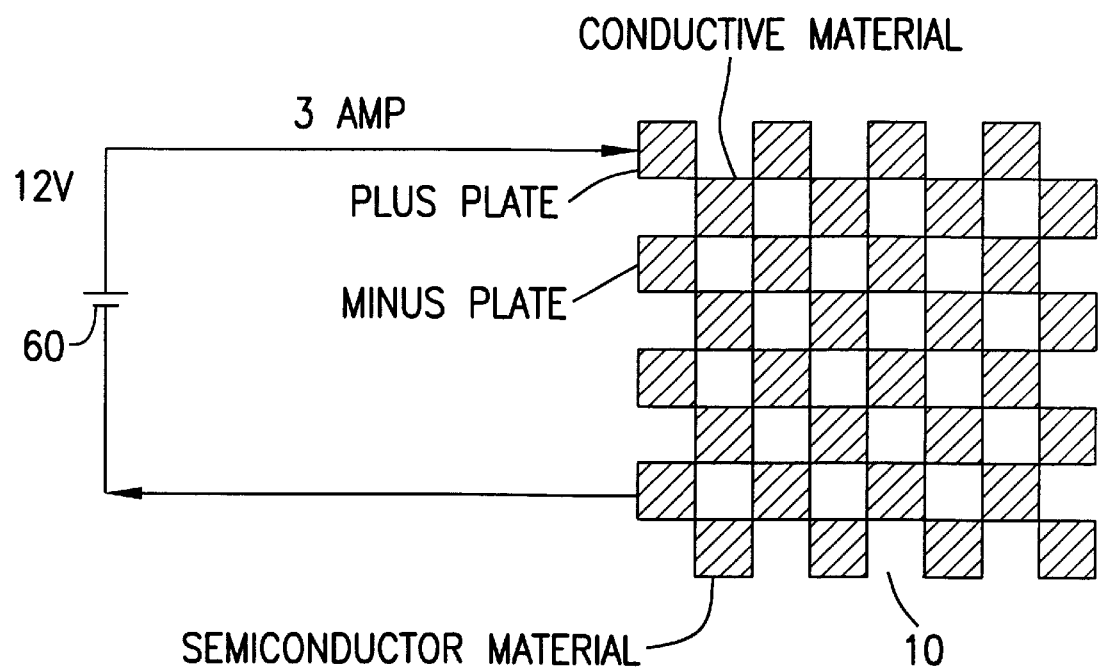
FIG. 2A illustrates an method for electronic cooling according to the present invention.
Figure 2B:
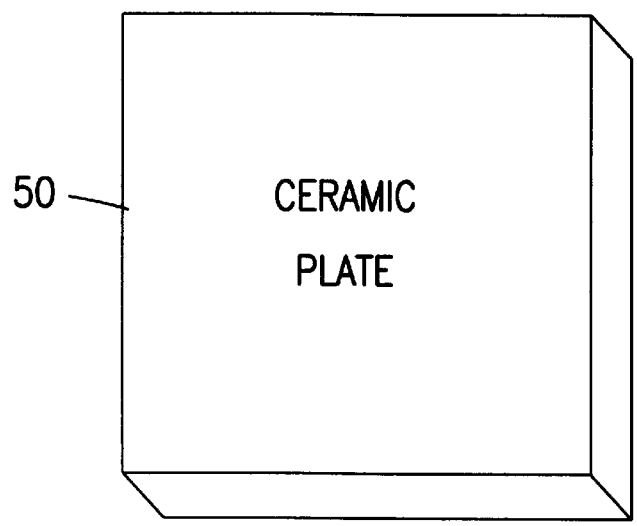
FIG. 2B illustrates a cooling plate which is provided for the method shown in FIG. 2A.

FIGS. 2A and 2B show electronic cooling according to the present invention. As illustrated in FIGS. 2A and 2B, the extruded filament 10, for example, the Ba-Ti filament or another semiconductor filament, is arranged in a checkerboard fashion. For example, the filament 10 is arranged in a coil shape between two ceramic plates 50, such as by a wave shape configuration of the filament 10 between two ceramic plates 50 illustrated in FIGS. 2A and 2B.

As a result of this wave shape configuration, a capacitor 110 (shown in FIG. 3A) is formed between segments of the wave-shaped coil. For example, each coil of the wave-shaped filament 10 forms a capacitor element C101, C102, C103 . . . C10n, each capacitor 100 being formed by, for example, two capacitor elements C101/C102 and C102/C103, etc. Each capacitor element forms a capacitor plate, the capacitor plates C101, C102 and C102, C103, etc. Being connected by, for example, adjoining portions L101, L102, L103 . . . L10n of respective capacitor elements 101, 102, 103 . . . 10n.

Adjoining capacitor elements are connected to the opposite terminals of a power supply 60. The power supply 60 can be, for example, a 12 volt, 3 amp power supply. The ceramic plates 50 prevent movement or expansion of the coil shaped filament 10. For example, as a result of the arrangement of the coil shaped filament 10 between the ceramic plates 50, expansion and contraction of the filament 10 is prevented.

In each capacitor 100, for example the capacitor 100 formed by the capacitor elements C101, C102, a first voltage is applied to capacitor plate C101 and a second voltage is applied to capacitor plate C102, the capacitor 100 being charged to the voltage difference, Vdiff. Each capacitor 100 in the arrangement according to the present invention is charged to Vdiff. In one embodiment of the present invention, there are approximately 225 capacitors 100, although in an embodiment of the present invention, one half of a capacitor 100 is not provided in order to make a half wavelength shift as described below.

Figure 3A:
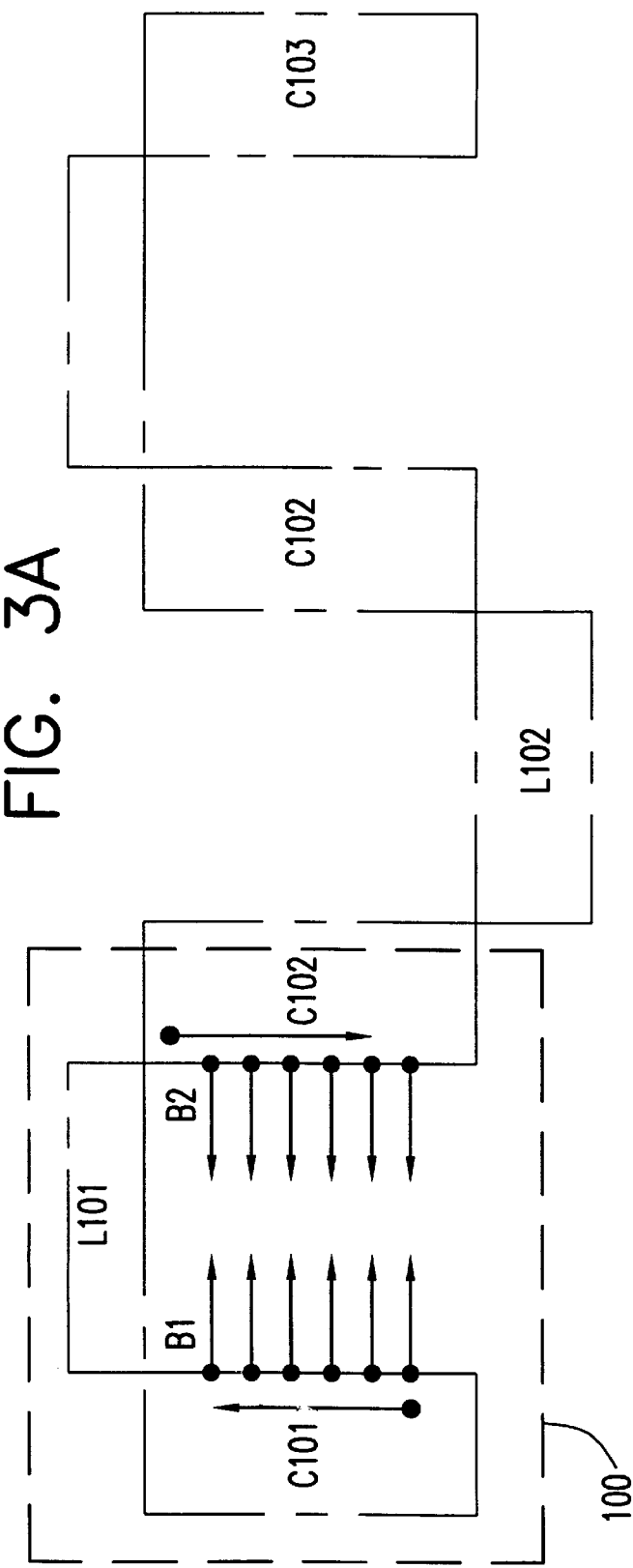
FIG. 3 illustrates the fields generated by the electronic cooling method according to the present invention.
FIG. 3B illustrates a material which is disposed between capacitor plates shown in FIG. 3A.

Once each capacitor 100 charges to the voltage Vdiff, then, for example, a first current can flow between capacitor elements C101 and C102 via adjoining portion L101 . The current flow in capacitor element C101 is in a first direction and generates a first magnetic field B1 between the elements C101 and C102 and oriented 90° from the direction of the first current, as illustrated in FIG. 3A. Further, the first current flows through the second capacitor element C102 in a second direction opposite the first direction of the current through capacitor element C101. Thus, a second magnetic field B2 is generated from the current through the capacitor element C102 between the elements C101 and C102 and oriented 90° from the direction of the first current through element C102, also as illustrated in FIG. 3A. The second magnetic field B2 is thus oriented opposite the first magnetic field B1 . Similar currents and magnetic fields are subsequently generated in each capacitor 100.

Figure 3B:
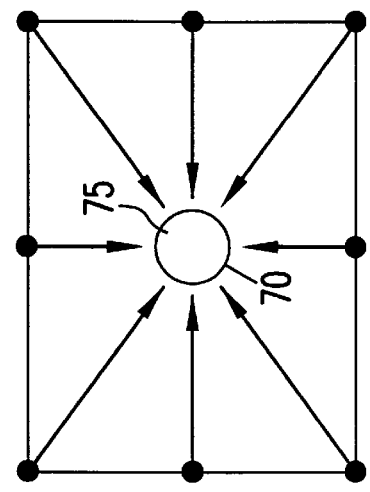

As the current flows through capacitor element C101 before C102, it is advantageous in the shifted one-half wavelength from the second magnetic field B2 so that the first and second magnetic fields created by the first current have an equal and opposite effect on the material 70 (shown in FIG.3B) disposed between the capacitor elements. The shifting of the first magnetic field can be accomplished, for example, by delaying the first current to the capacitor element C102 in the first capacitor 100 by reducing the length of the adjoining material L101 by an amount equivalent to half of the wavelength of the capacitor 100, e.g., one half of the separation distance of the capacitor elements C101, C102.

As a result of the opposite magnetic fields B1, B2 generated between each pair of capacitor elements, e.g., C101/C102, C102/C103, etc., the electrons of the material 70 between the capacitor elements are urged towards a center region between the capacitor plates, e.g., capacitor elements C101/C102, C102/C103, etc. The material 70 can be, for example, any suitable material, such as air or Barium. As electrons near the center region 75 (shown in FIG. 3B) between the capacitor plates, the movement of the electrons decrease. At a certain point in the center region, the effect of the magnetic fields B1, B2 are equal and opposite and thus there is no movement of electrons at this point of the center region. Because there is no movement of electrons at this point, there is no heat at the center region, e.g., the center region is now at a temperature range of 0°–5° K. The processing of the material 70 near the center region at the temperature range of 0°–5° K and the application of a second magnetic field greater than the first magnetic field effects the release of the valence electrons (e.g., p, d or f electrons) forming the connection between atoms forming the molecules of the material 70, but does not release electrons contained within the shield of the nucleus of the atoms. For example, the voltage applied to the variac is increased to about 100,000 volts to create the second magnetic field. A corrected core is thereby formed.

When the actual resistance of the capacitor 100, e.g., Xc, is equal to the actual resistance of the coil shaped filament 10, e.g., X1, the result is zero force in any direction from the first current flowing through the capacitor elements C101, C102. As is known, $Xc = \frac{1}{2}\pi fc$, wherein c represents the capacitance of the capacitor 100 and f represents the resonant frequency when the resistance of the capacitor 100 equals the resistance of the filament 10. Also as is known, $X1 = 2\pi fl$, wherein l equals the l of the coil shaped filament 10. Therefore, $f = \frac{1}{2}\pi\sqrt{1c}$. At this frequency f, the coil shaped filament 10 and the capacitor 100 are in a resonance relationship. This frequency f is also equal to $1/\lambda$, wherein $\lambda$ equals the separation distance between the capacitor elements of each capacitor 100. Therefore, values for c and l can be appropriately calculated to create the resonant frequency, e.g., select c or l and solve for the remaining value, or the frequency can be calculated if c and l are known.

At this point, the core is jacketed with a single atomic layer of barium by subjecting the corrected core to a gas, preferably $SO_6$, at room temperature while applying a voltage to the variac. $SO_6$ is preferred because it has a molecular weight of 128.06, which approaches the 137.33 molecular weight of the Ba jacketing material. The applied voltage is greater than 100 kV, preferably about 150 kV. This process draws barium from the corrected core and forms a one-atomic-layer-thick jacket from the barium that is preferably separated from the corrected core by a gap of 0.43 Å. The voltage defines the gap.

Once the jacketing process is complete, leads are applied to complete the construction of a continuous supercapacitor as shown in FIG. 1. Leads 1 and 2 are placed in electrical contact with jacket 4 and core 6, respectively. The connection of lead 2 to core 6 is facilitated by leaving a portion of the core unjacketed.

As previously noted, the continuous supercapacitor of the present invention comprises a corrected core and a jacket separated by a gap.

By "corrected" is meant that the core has been treated such that the electrons in s electron shells remain associated with their respective nuclei, while outer valence electrons, such as in p, d, f electron shells dissociate from their respective nuclei such that they can occupy the gap between the core and jacket.

The core comprises one or more elements. Preferably, at least one of these elements is a metal. More preferably, the core comprises two or more elements separated by no more than one column of the periodic table. A most preferred core material is a barium-titanium.

The jacket of the continuous supercapacitor of the present invention is a single atomic layer in thickness, is electrically conductive and is composed of one of the elements found in the core. Most preferably, the jacket is barium. The jacket functions as a Faraday cage for the outer valence electrons within the gap.

The gap is preferably dimensioned such that the outer valence electrons vibrating within the gap produce a frequency of about 1 to 5 gHz. More preferably, a gap of about 0.43 Angstroms (about 1⅔ electrons) is selected which will produce a frequency of about 2.45 gHz. 2.45 gHz is the vibrational frequency of water molecules. The energy produced over the lifetime of the device is derived from the energy put into the device during processing.

The continuous supercapacitor of the present invention is advantageous, for example, in that it provides a wide frequency range (e.g., 0.0001 Hz to 5 gHz), a wide dynamic range, e.g., of $10^{-6}$ to $10^6$ psi or ($\mu$torr to Mbar), a low acoustic impedance, with a close match to water, human tissue and adhesive systems, a high elastic compliance, a high voltage output, a high dielectric strength withstanding strong fields (e.g., 75V/$\mu$m), high mechanical strength and impact resistance (e.g., $10^9$–$10^{10}$ pascal modulus), and a high stability, with resistance to moisture, most chemicals, oxidants, and intense ultraviolet and nuclear radiation.

The continuous supercapacitor of the present invention can be used in a wide range of applications, including energy generation, freezing prevention, friction reduction, condensation treatment, noise reduction, disinfection, water heating, medical applications, silencing, production of various pressure fields, and prevention of growth of living organisms. Each of these applications flows directly from the nature of the material itself, which acts as a charge generating source with associated gHz vibration of the jacket.

For example, as an energy generator, the continuous supercapacitor according to the present invention can be used to replace practically any type of electrical power source. Moreover, the vibration of the jacket can be used to reduce friction between, for example, a fluid plastic and the walls of an orifice, a moving object within a liquid, water and the walls of a pipe, and so forth. The energy from the device can be used, for example, to prevent freezing of condensation on cooling units in air conditioners or deep freezers, to prevent freezing of moisture on the leading edge of airplanes, and to prevent doors and windows from freezing. The device can also be used, for example, to dry or prevent condensation in containers used for overland or overseas transportation, in areas of radiation, and in fine mechanical instruments, and it can be used to protect humans or equipment in high electrostatic areas. The device can be used for noise reduction, for example, in urban areas and in flying machines having high noise levels such as helicopters, and it can be used to build noise insulation barriers in open areas and ear plugs that essentially cut out noise completely. The device can be used, for example, to design toilet seats having self-disinfecting capability and to design coverings that kill living organisms or other bacteria having high bacteria content within pipes or taps or in similar areas used by large numbers of people.

The device can be used, for example, to create systems to heat, electrolytically treat or desalinate water, to heat food within mobile containers without the necessity of external energy sources, to prevent cooling of equipment or tools in cool environments or during cool periods, to control the viscosity of water and other fluids, and to provide heat for mercury lights. It is also contemplated that the device of the present invention may be used in medical applications such as, for example, prevention of narrowing of veins, bandage warming, cancer immunization, systems for blood oxygen level control, and computerized bed terminals, e.g., a sheet able to continuously monitor the state of health of a patent without introducing instruments into the patient's body. The device can be use to produce pressure fields to provide, for example, netting that prevents dust or small creatures from passing through it, removal of solid particles from a liquid by producing low pressure fields which cause the solid particles to settle, laminar flow in liquids, cavitation prevention in water compressors, and a tunnel for flow within a medium without the necessity of introducing solid walls into the medium. The device can also be used to, for example, prevent growth of living organisms and prevent barnacle growth on underwater surfaces of ships or other sea-bound installations (anti-fouling).

I claim:

1. A continuous supercapacitor comprising
   a core of at least one atomic element; and
   a jacket composed of a predetermined atomic element selected from the at least one atomic element of the core, the jacket being one atomic layer in thickness, the core being separated from the jacket by a gap containing outer valence electrons with the jacket acting as a Faraday cage for the electrons, the gap being dimensioned such that the electrons vibrate at a frequency ranging from about 1 gHz to 5 gHz.

2. The continuous supercapacitor of claim 1, wherein the core comprises at least two of the at least one element separated by a single column in a periodic table.

3. The continuous supercapacitor of claim 2, wherein two of the at least one element are separated by a single column in the periodic table.

4. The continuous supercapacitor of claim 3, wherein the core comprises barium and titanium.

5. The continuous supercapacitor of claim 1, wherein the jacket is composed of a metal material.

6. The continuous supercapacitor of claim 5, wherein the jacket is composed of barium.

7. The continuous supercapacitor of claim 1, wherein the gap is dimensioned to generate a frequency of about 2.45 gHz.

8. The continuous supercapacitor of claim 1, wherein the core has a diameter of about 0.001 mm.

* * * * *